United States Patent
Kraz

[11] Patent Number: 6,144,341
[45] Date of Patent: Nov. 7, 2000

[54] ELECTROMAGNETIC EMISSION LOCATION AND MEASUREMENT APPARATUS AND METHOD

[75] Inventor: Vladimir Kraz, Santa Cruz, Calif.

[73] Assignee: Credence Technologies, Inc., Soquel, Calif.

[21] Appl. No.: 09/135,912

[22] Filed: Aug. 18, 1998

Related U.S. Application Data

[60] Provisional application No. 60/055,633, Aug. 18, 1997.

[51] Int. Cl.[7] .................................................. G01R 29/10
[52] U.S. Cl. ........................................... 343/703; 343/841
[58] Field of Search .................................... 343/703, 841, 343/789, 702; 455/89, 95, 226.1; 324/627, 628; 342/127, 131, 133

[56] References Cited

U.S. PATENT DOCUMENTS

| | | | |
|---|---|---|---|
| 3,740,754 | 6/1973 | Epis | 343/789 |
| 4,134,119 | 1/1979 | Sandoz et al. | 343/703 |
| 5,016,020 | 5/1991 | Simpson | 343/703 |
| 5,373,304 | 12/1994 | Nolan et al. | 343/841 |
| 5,410,324 | 4/1995 | Bolomey et al. | 343/703 |
| 5,423,072 | 6/1995 | Iwashita et al. | 343/703 |
| 5,444,866 | 8/1995 | Cykiert | 455/89 |
| 5,507,012 | 4/1996 | Luxon et al. | 343/841 |

FOREIGN PATENT DOCUMENTS

405312865  11/1993  Japan ..................... 343/703

*Primary Examiner*—Tan Ho
*Attorney, Agent, or Firm*—Gary Cary Ware & Freidenrich LLP

[57] ABSTRACT

An apparatus for detecting, locating and measuring electromagnetic radiation is provided. The apparatus may be a self-contained, portable device which permits a user to detect, locate and measure electromagnetic radiation from distance away from the radiation source in presence of interference.

35 Claims, 10 Drawing Sheets

ELECTROMAGNETIC EMISSION LOCATION AND MEASUREMENT APPARATUS AND METHOD

This application claim benefit of provisional application Ser. No. 60,055,633 filed Aug. 18, 1997.

BACKGROUND OF THE INVENTION

This invention relates generally to electronic devices and in particular to test and measurement instruments for detection and measuring the strength of an electromagnetic field.

There are many situations and applications where it is desirable to detect, locate and measure electromagnetic emission at some distance from the emitting object. For example, in the case of high voltage power equipment and cables, high frequency electromagnetic emission from a motor or a generator is an indication of an internal problem in the motor or the generator, such as when the internal insulation in the motor or generator is beginning to break down. It is desirable to be able to detect this high frequency emission, but it is unsafe for a human to approach the high-voltage lines. Current methods for identifying the presence of high-frequency emissions involves carrying bulky normally stationary equipment, such as spectrum analyzer, to the site where the identification is being conducted. Even with this conventional spectrum analyzer, it is impossible to determine from which particular cable or piece of equipment the electromagnetic field is emanating. In addition, the quantitative analysis of the emitted power is very difficult to perform using conventional equipment because the conventional receiving antennae receive signals from a variety of different emission sources rather than just from the emission source in question. Therefore, there is no practical way, with these conventional systems, to estimate the emitting power of the emission source. It is desirable, however, to be able to accurately measure the emitting power of the emission source.

Another example of a situation where it is desirable to detect, locate and measure electromagnetic emission at some distance from the source is wireless area networks, where so-called access points (i.e., radio network nodes) are situated high on the ceiling, etc.. It is advantageous and desirable to be able to verify proper radio operation of the particular access point from the ground without the need to climb up a ladder. Conventional systems and devices for troubleshooting and diagnosing problems of such access points allow neither for diagnostics to be run for a particular access point nor for determining the output power of the access point.

It is also important to be able to measure emission parameters in the presence of interfering signals. Current systems which offer some means of restricting measurements to a specific direction of emission are bulky and therefore cannot be made truly portable.

Thus, none of the conventional systems permit electromagnetic radiation to be detected, accurately located and measured at some distance from the emission source. In addition, none of the conventional systems or devices may be embodied in an inexpensive, hand-held device. Therefore, it is desirable to provide an apparatus for detecting, locating and measuring electromagnetic radiation which solves the problems of conventional systems and devices and it is to this end that the invention is directed.

SUMMARY OF THE INVENTION

In accordance with the invention, an apparatus for detecting, locating and measuring an electromagnetic emission is provided. In accordance with one aspect of the invention, the apparatus may be an inexpensive, easy-to-use, portable and fully self-contained apparatus that can detect and measure strength and other properties of the electromagnetic field coming from specific sources with high directional accuracy. In addition, the apparatus will permit a user of the apparatus to measure the emitting power of a emission source at a safe distance away from the emission source. The apparatus also has the advantage that it can be used for personal use, both due to its small cost and its small size, thus providing better quality products and processes wherever this invention is used. The apparatus and method in accordance with the invention saves money on electromagnetic testing and reduces time-to-market for manufacturers of the electronics equipment. The apparatus in accordance with the invention, however, is not limited to a portable or a self-contained apparatus.

In more detail, a preferred embodiment of the apparatus in accordance with an aspect of the invention may be an electronic test apparatus that measures an incoming electromagnetic field with a highly-directional antenna, that displays the measured field strength, and generates an indication (either audible or visual) of the field strength of the electromagnetic field. The apparatus may also include a built-in laser pointer which helps to identify a source of the measured emission. In addition, the apparatus may measure the distance from the emitting source to the apparatus, may perform calculations involving the measured field strength and the measured distance from the source, and may generate an estimated value of the transmitting power of the measured source.

The preferred embodiment of the invention may advantageously be fully self-contained and portable (i.e., pocket-sized) so that no other equipment or components are needed for the operation of the apparatus. In addition, the apparatus may have a minimum number of controllers so that it is extremely easy to use and requires limited training.

The apparatus, in accordance with one embodiment of the invention, includes a directional antenna, an RF pre-amplifier that boosts the received signal, a detector that generates a DC voltage as a function of an amplitude of the received signal, a frequency counter, a DC amplifier, a logarithmic voltage converter, a means for visual indication of the received signal strength, an audio field strength indicator, an electronic range-finder, and a microprocessor that performs necessary calculations in order to derive the emitting power of the source.

In accordance with another aspect of the invention, the apparatus may include a replaceable antenna so that various types of antennae may be connected to the apparatus. In this aspect of the invention, a cable may be connected to an antenna connector of the apparatus and thus an RF signal coming from any source over the cable may be analyzed. Further objectives and advantages of the invention will be found from consideration of the ensuing description and the accompanying drawings.

BRIEF DESCRIPTION OF THE DRAWINGS

A written description setting forth the best mode presently known for carrying out the present invention and for implementing and using the apparatus is provided by the following detailed description of an illustrative embodiment of the invention and by the attached drawing figures which will now be briefly described.

DETAILED DESCRIPTION OF THE PREFERRED EMBODIMENTS

The invention is particularly applicable to a self-contained, portable electromagnetic field detection and measurement device and it is in this context that the invention will be described. It will be appreciated, however, that the apparatus and method in accordance with the invention has greater utility, such as to other electromagnetic field detection and measurement devices and systems.

Figure 1A:
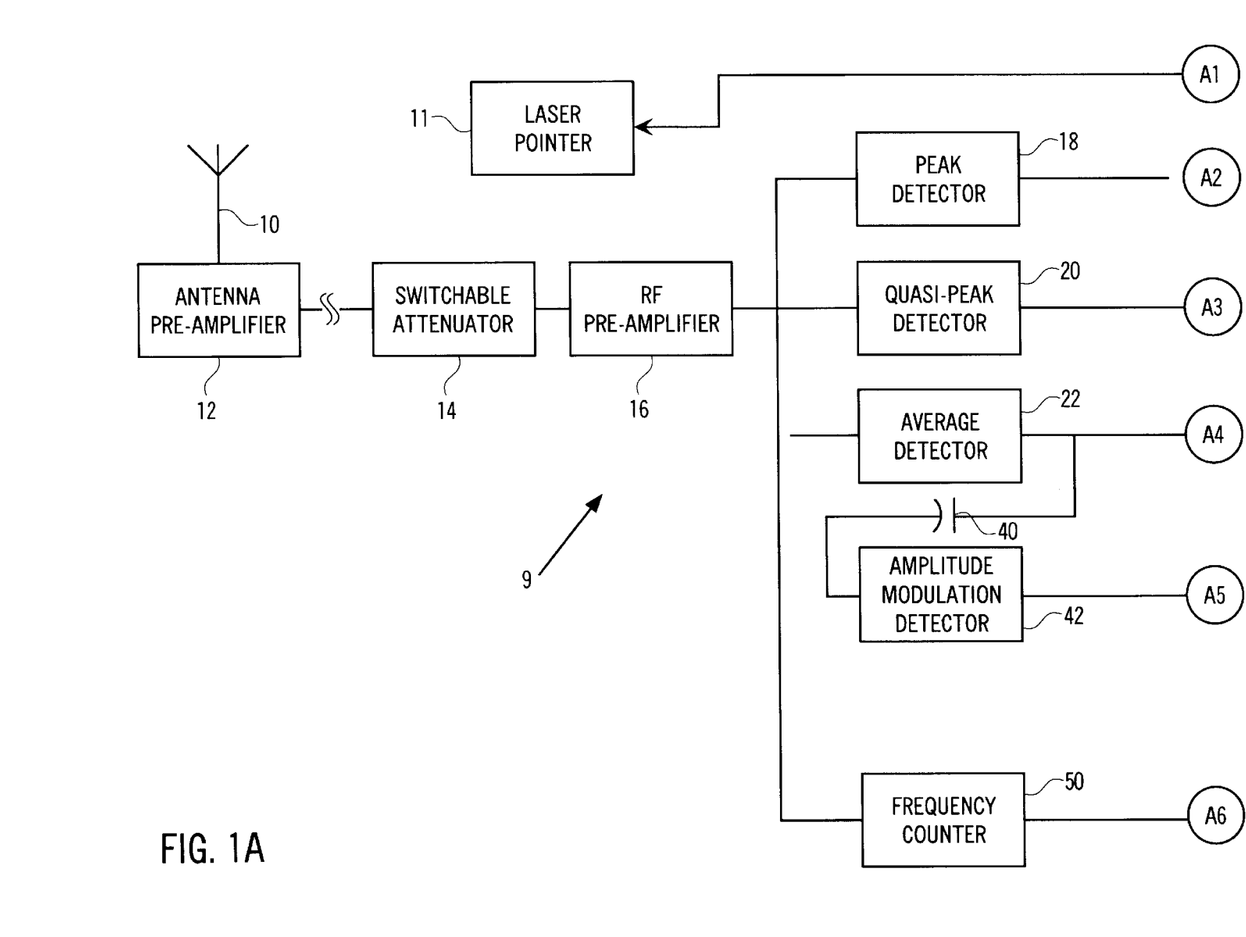
FIG. 1A and FIG. 1B are block diagram of a first embodiment of the apparatus in accordance with the invention.
Figure 1B:
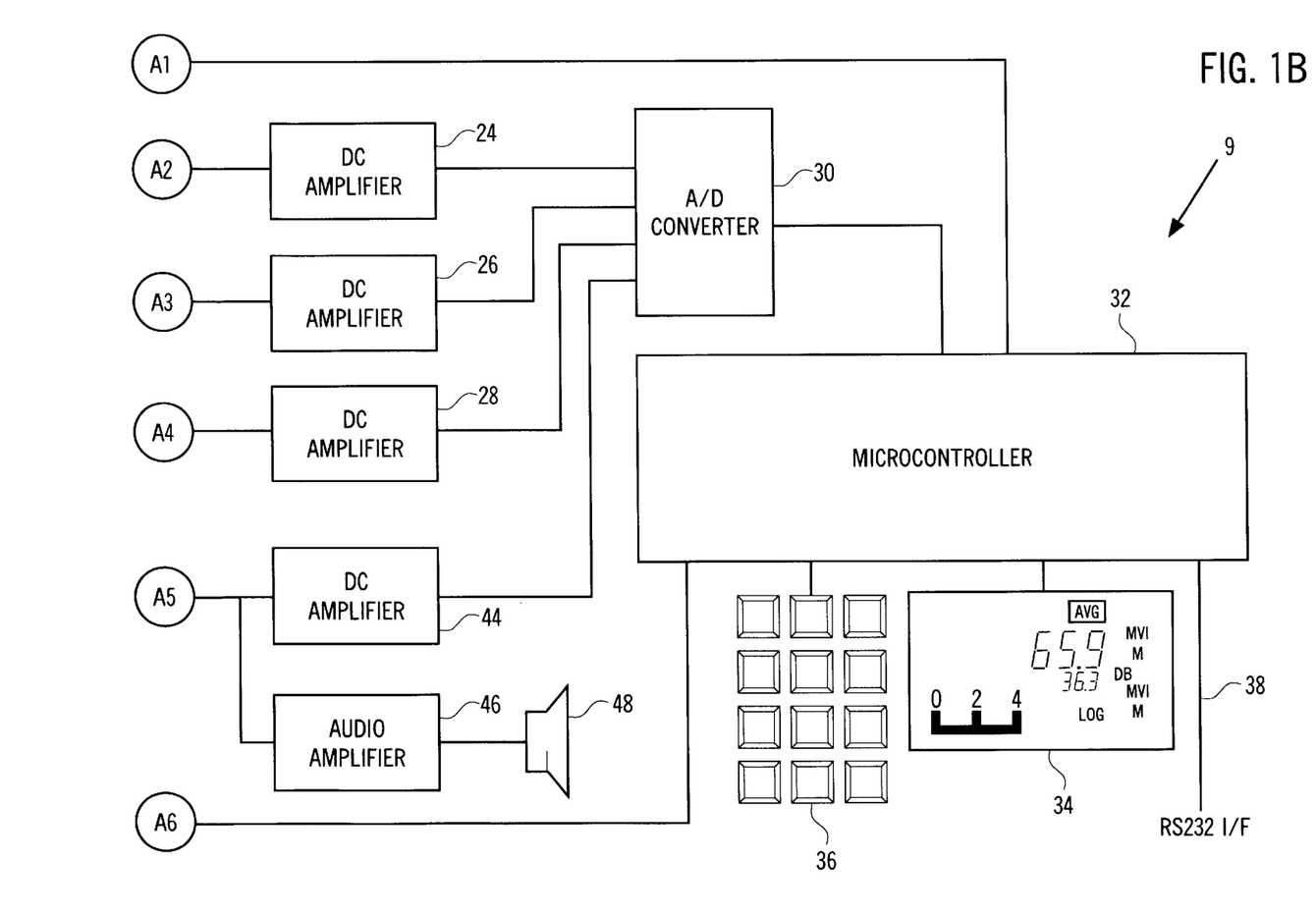

FIGS. 1A and 1B are block diagram of an embodiment of an electromagnetic field detection and measurement apparatus 9 in accordance with the invention. The apparatus 9 may include a directional antenna 10 which receives electromagnetic signals from predominantly one direction. The direction of the directional antenna may be indicated by a laser pointer 11 that is mechanically-aligned with the antenna. For a broad-band frequency operation, the antenna 10 may be intentionally de-tuned as described below with reference to FIG. 7.

The antenna 10 may include an optional internal pre-amplifier 12 for improving the sensitivity of the apparatus 9. When a signal is received by the antenna, it may be then communicated to an input of a switchable attenuator 14 that reduces the input signal when it exceeds certain levels in order to increase the dynamic range of the apparatus. The attenuator 14 outputs the attenuated signal to an AC radio frequency (RF) preamplifier 16 that boosts the incoming signal and provides the necessary gain when a weak signal is received by the antenna. The signal at the output of the preamplifier 16 is a replica of the input signal received by the antenna except that it has been magnified in amplitude (i.e., amplified). The output signal of the preamplifier 16 is connected to one or more detectors. The invention is however, not limited to any particular number of detectors. In the example shown, there may be a peak detector 18, a quasi-peak detector 20 and an average detector 22. The detectors 18–22 generally rectify the alternating-current (AC) signal received from the preamplifier and convert the AC signal into a direct-current (DC) voltage. The peak detector generates a DC voltage equal to the peak value of the AC signal. The quasi-peak detector may be used with pulsed signals to generate a DC voltage equal to the peak of the pulsed AC signal. A conventional peak detector may be unable to determine a peak value for a pulsed signal. The average detector generates a DC voltage equal to the average value of the AC signal as will be described below in more detail. The DC voltages output from the detectors 18–22 may be then amplified by a DC amplifier 24, 26 and 28 connected to each detector.

The outputs of the DC amplifiers 24–28 may be connected to the inputs of a multi-channel analog-to-digital (A/D) converter 30. The A/D converter transforms the DC voltage signals into digital information that is supplied to a microcontroller 32. The microcontroller 32 in turn drives a display 34, that may be for example, a liquid crystal display (LCD). In this particular embodiment, the display 34 shows such parameters as signal strength in linear and logarithmic scales, real-time signal strength indication and other values as will be described in more detail below. A keypad 36 may be connected to the microcontroller 32 and permits a user of the apparatus 9 to control the functions carried out by the microcontroller. The microcontroller 32 may provide an interface 38 to a computer (not shown) via one of the conventional interface means, such as RS232, etc. The specific construction of the microcontroller is not a subject of this invention and thus is not described in great detail. For purposes of this example, the microcontroller may be any conventional microcontroller which can perform the functions required by the apparatus.

An output of the average detector 22 may be connected via a decoupling capacitor 40 to the input of an amplitude modulation detector 42 which measures the amplitude modulation of the received signal and outputs a DC voltage corresponding to the amplitude modulation. The output of the amplitude detector 42 may in turn provide a DC voltage signal to the input of a DC amplifier 44. The output of the DC amplifier 44 may be connected to one of the inputs of the A/D converter 30. Using this information, the microcontroller 32 may then calculate the amount of amplitude modulation of the input signal by calculating the ratio of the magnitudes of the amplitude modulation signal and the signal from the average detector 22.

Other functions that the microcontroller can provide are such functions as providing a reference value (Reference feature), holding data (Hold Feature), a Data Logging feature, etc. The reference value function sets the current reading of the measured parameter as virtual zero (i.e., a reference) and then displays the current readings as the difference between the current readings and the reference value. The proposed embodiment has a dual-line display that shows, on one line of the display, the reference value of the signal (i.e. 1 V/m) and, the other line of the display, the delta value between the reference value and the current value (i.e. −0.23 V/m).

The hold feature maintains the display with its current values at the time the Hold feature was selected so that the value of the display may be viewed later. The data logging function, in the proposed embodiment, has a number of features. For example, it may include a time/date stamp with each reading, it may provide time-based and event based data recordings (event-based recording is when the device records the data when the readings exceed a pre-set level), it may average data recording (when the device averages the data during the pre-set interval and records the resulting averaged value), etc.

Returning to the amplitude modulator detector 42, the output of the amplitude modulation detector 42 may be connected to the input of an audio amplifier 46 which in turn drives a speaker 48 which allows a user to listen to the detected signal. Returning to the preamplifier 16, the output of the preamplifier 16 may also be connected to the input of a frequency divider (frequency counter) 50 that converts the high-frequency input AC signal into a series of lower-frequency pulses that may be supplied to the microcontroller 32. The microcontroller may then interpret the frequency of the pulses from the frequency divider 50 to generate a value corresponding to the frequency of the signal received by the antenna and then cause the display 34 to display the signal frequency. Now, a second embodiment of the invention will be described with reference to FIGS. 2A and 2B.

Figure 2A:
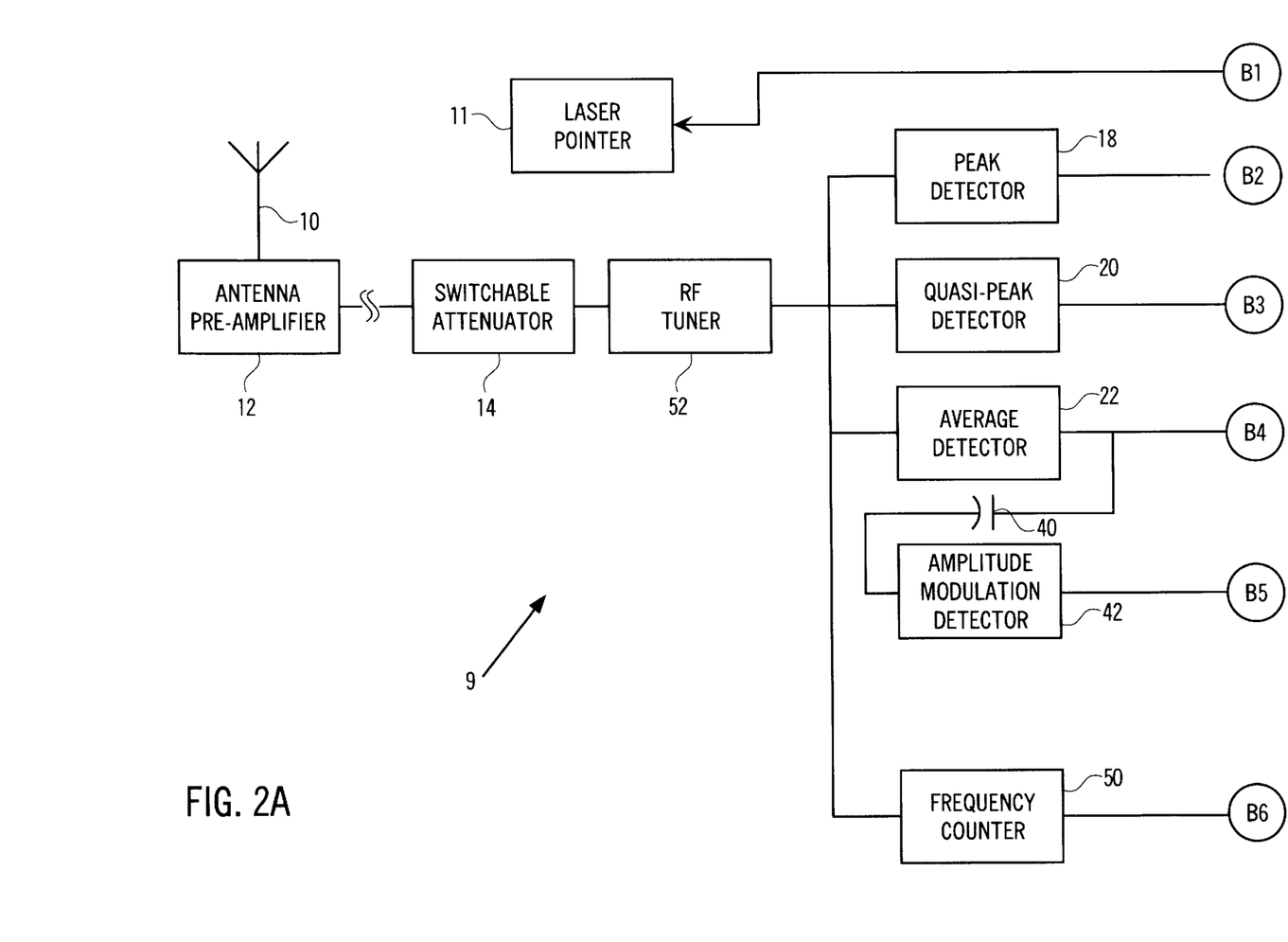
FIG. 2A and FIG. 2B are block diagram of a second embodiment of the apparatus in accordance with the invention which includes a tuner.
Figure 2B:
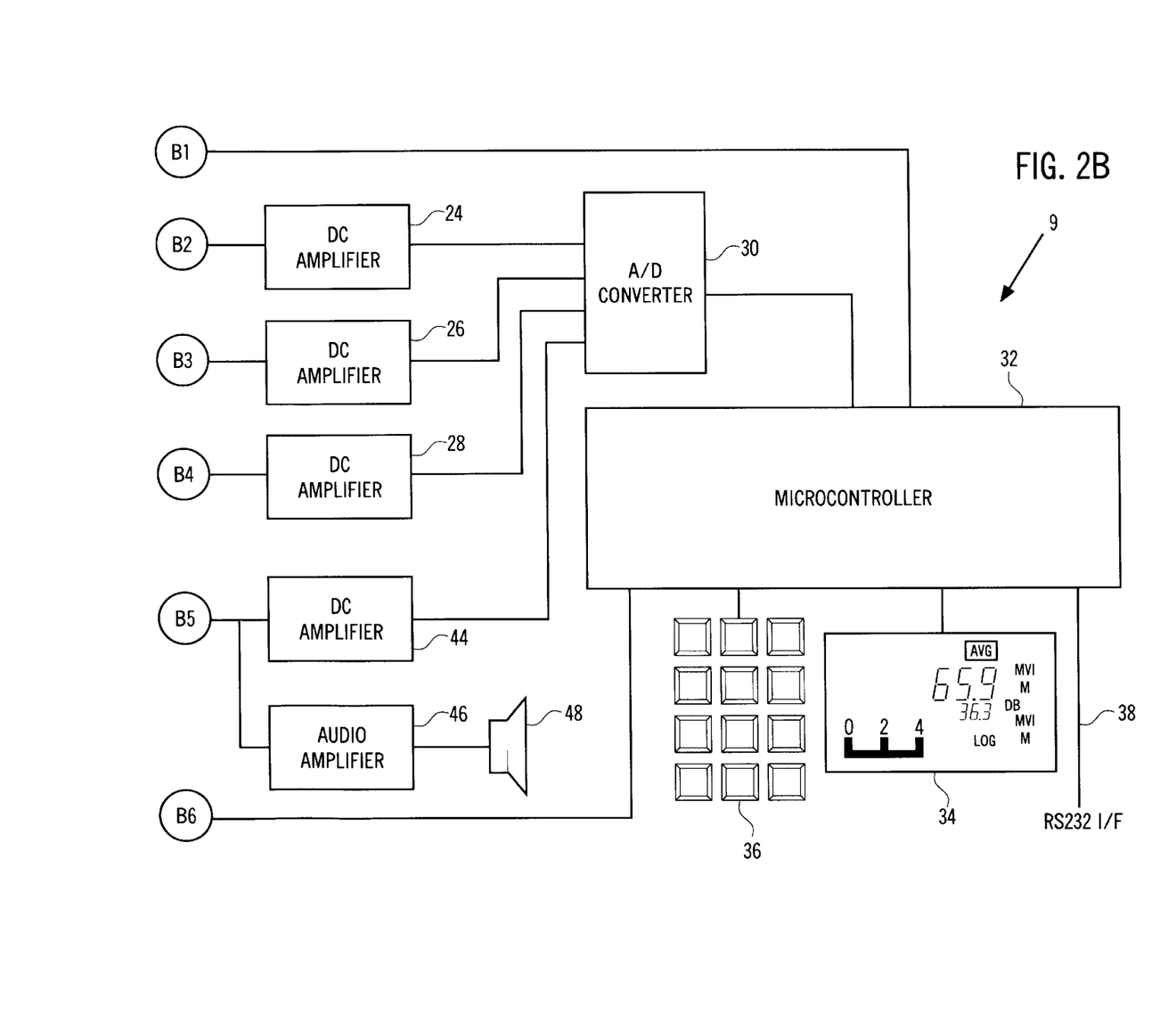

FIG. 2 illustrate a second embodiment of the apparatus in accordance with the invention. In this embodiment, the apparatus 9 in accordance with the invention contains many of the same blocks as the embodiment shown in FIG. 1A and FIG. 1B and these blocks will not be described again here. In this embodiment, in addition to the elements of FIG. 1A and FIG. 1B, the apparatus may also include a radio frequency (RF) tuner 52 connected to the switchable attenuator 14. The RF tuner 52 permits the user of the apparatus to select a particular frequency of signals to detect and measure so that the display 34 may display the parameters for electromagnetic fields only at the selected frequencies. Now, a third embodiment of the apparatus in accordance with the invention will be described with respect to FIG. 3A and FIG. 3B.

Figure 3A:
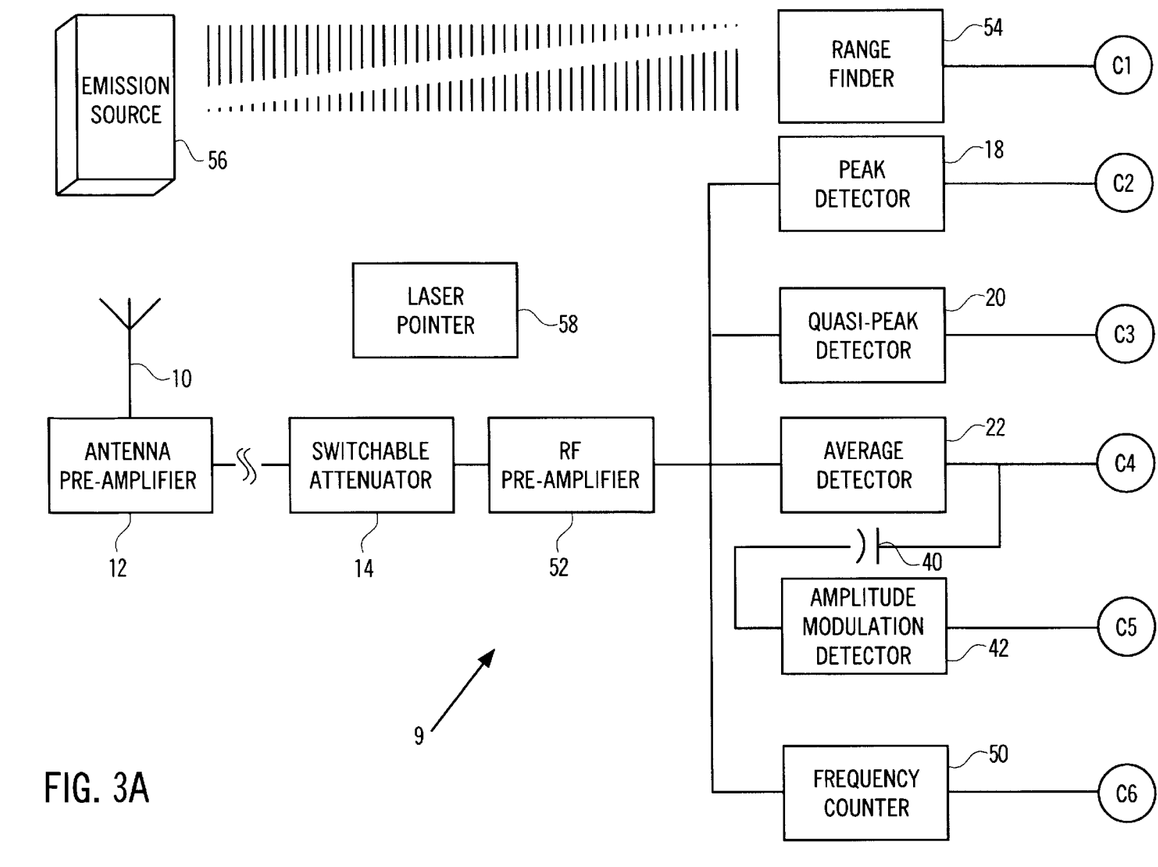
FIG. 3A and FIG. 3B are block diagram of a third embodiment of the apparatus in accordance with the invention which includes a range finder.
Figure 3B:
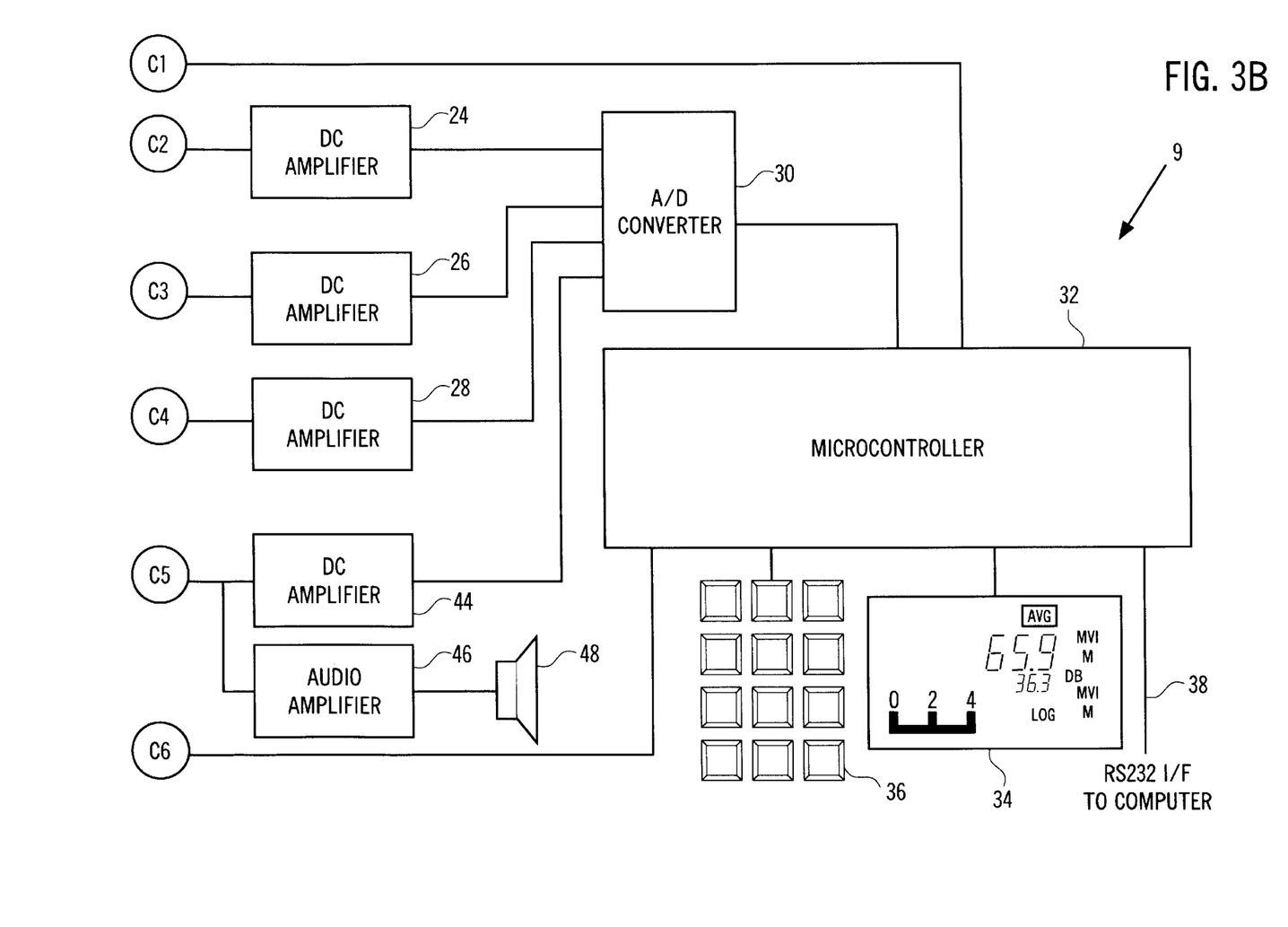

FIG. 3 illustrate a third embodiment of the apparatus in accordance with the invention. In this embodiment, the apparatus 9 in accordance with the invention contains many of the same blocks as the embodiment shown in FIG. 1 and these blocks will not be described again here. In addition to the elements shown in FIG. 1, this embodiment may also include a range finder 54 which permits the distance between a radiation source 56 and the apparatus 9 to be determined. In accordance with the invention, the range finder may use ultrasonic or laser energy to determine the distance between the radiation source and the apparatus. Therefore, in addition to measuring the field strength of the electromagnetic radiation, the apparatus in this embodiment may also measure the distance to the emission/radiation source 56 and then calculates the emitting power of the radiation source 56 as described below.

An electronic range finder 54 may measure the distance from the apparatus 9 to the radiation source 56 and then provides a digital output value, corresponding to the distance between the radiation source and the apparatus, to an input of the microcontroller. Based on the distance value generated by the range finder, the microcontroller 32 may then calculate the anticipated power of the emitting source and cause the display 34 to display the power value on the display 34. Even without the range-finder capabilities, the apparatus in accordance with the invention can still provide an estimation of the power of the emitting source if the distance to the measured radiation source is entered manually by the user.

This added functionality of the apparatus 9 of FIG. 3 will enable a user to quantify the power of the emitting source from a safe distance for purpose of troubleshooting and diagnostics. The formula for calculating the power of the radiation source is commonly known as:

$$P = \frac{E^2 * R}{(30 * G)}$$

where P is the calculated power of the source in watts [W], E is the measured field strength in volts per meter [V/m], R is the distance between the emission source and the receiving antenna in meters [m], and G is the antenna gain (which is a property of a particular antenna being used). The antenna gain is known at the time the apparatus is manufactured and may be programmed into the apparatus. The measured field strength signal may be derived from the output of the average detector 22. A laser pointer 58, which is similar to the laser pointer 11 described above, may help a user of the apparatus to pinpoint the source of the measured emission when used in combination with a directional antenna as described below. Now, more details about the RF portion of the apparatus in accordance with the invention will be described.

Figure 4:
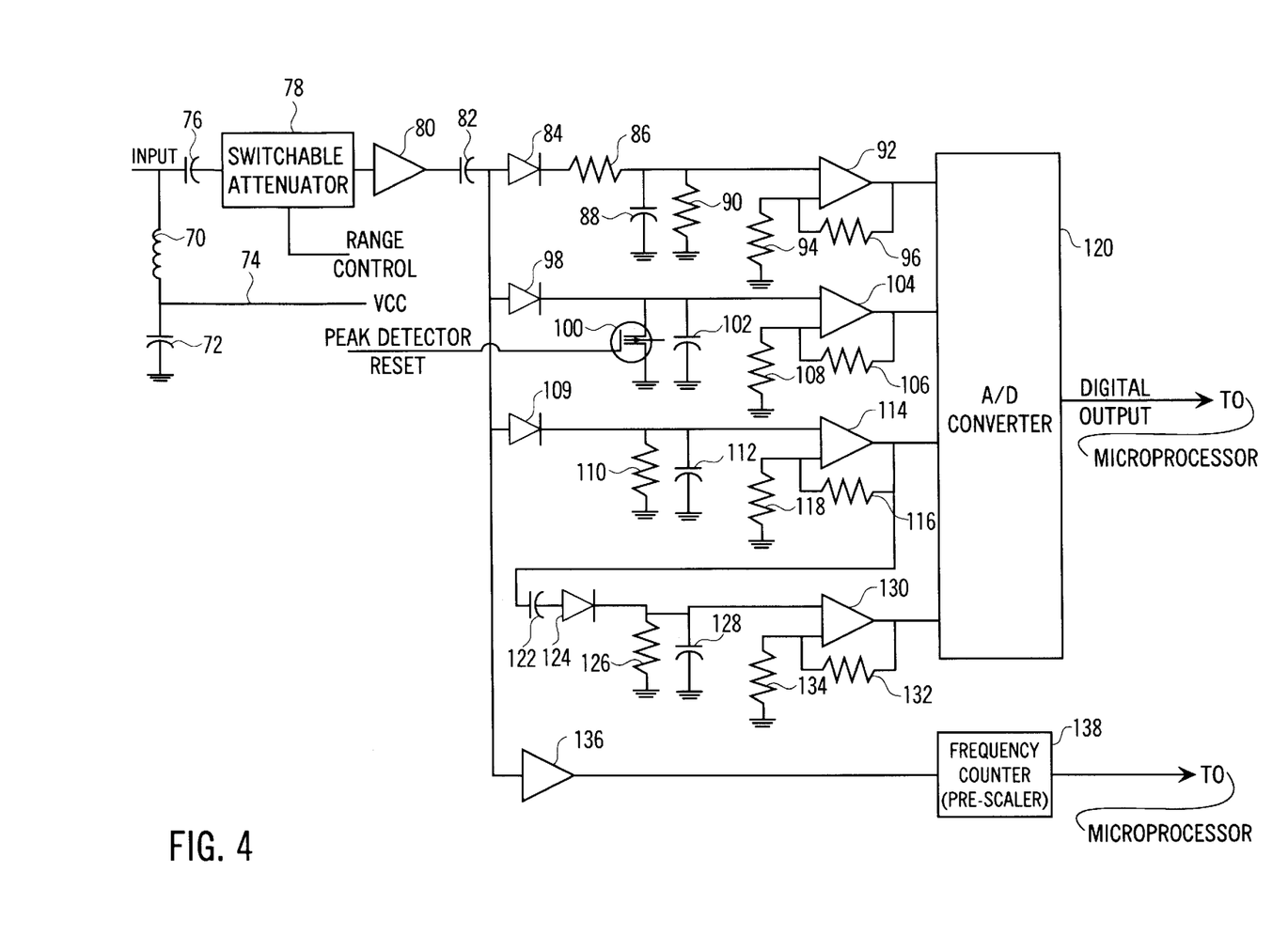
FIG. 4 is a schematic diagram illustrating an example of a front end of the apparatus in accordance with the invention.

FIG. 4 is a schematic of the front end (RF section) of any of the embodiments of the invention. The RF section may be the electronics which are connected to the A/D converter. At the input of the device where the signal from the antenna is received, there is an inductor 70 and a capacitor 72 that in conjunction with a power supply (not shown) provide a phantom power supply to the preamplifier in the active antenna as described below. The antenna amplifier, however, is not absolutely necessary for the operation of the invention and is added as an additional means for improving the sensitivity of the apparatus. The signal from the input passes through a decoupling capacitor 76 to the input of a switchable attenuator 78. The attenuator 78 extends the dynamic range of the measurements by lowering a strong input signal to a level where it is not clipped by the electronics in the apparatus. When the signal is weak, the attenuator may be switched off. Therefore, the usable dynamic range of the apparatus is extended by a number equivalent to an attenuation factor. The attenuator is controlled by the microcontroller that determines at what signal level the attenuator needs to be activated and feeds that data to a range control input of the switchable attenuator.

If, after the attenuator, the input signal still exceeds the maximum allowed signal level, the microcontroller may display an overload indicator on the display, as well as entering a log entry in the data logger, if the data logger feature is currently being used. One technique for detecting an overload is by measuring the voltage at the output of the peak detector and if it exceeds a predetermined limit, such as 100 volts for example, the apparatus is overloaded and the measurement results cannot be trusted.

The output signal from the attenuator 78 passes to an RF preamplifier 80 that boosts the input signal to a usable level. The output of the preamplifier 80 is connected, via a decoupling capacitor 82, to the inputs or one or more detectors. As shown in FIG. 2, these detectors may include a peak detector, a quasi-peak detector and an average detector. The quasi-peak detector is built from a diode 84, resistors 86 and 90, a capacitor 88, and an amplifier constructed from an operational amplifier (opamp) 92 and resistors 94 and 96. Similarly, the peak detector may be constructed out of a diode 98, a switching transistor 100, a capacitor 102, an opamp 104 and resistors 106 and 108. The switching transistor 100 may be controlled by the microcontroller and the microcontroller resets the voltage accumulated on the storage capacitor 102. The average detector is similarly constructed from a diode 109, a resistor 110, a capacitor 112, an opamp 114 and resistors 116 and 118. Outputs of the amplifiers 92, 104, 114 are connected to the inputs of A/D converter 120.

An amplitude-modulation detector receives a signal from the output of the average detector, which includes operational amplifier 114. This signal from the operational amplifier 114 passes through a decoupling capacitor 122 to the amplitude detector. The amplitude detector may be constructed from a diode 124, a resistor 126, a capacitor 128 and an operational amplifier (opamp) 130 with the accompanying resistors 132 and 134. The output of the opamp 130 is also connected to one of the inputs of the A/D converter.

The input of another RF preamplifier 136 is connected to the capacitor 82 and the output of the preamplifier 136 is connected to a frequency pre-scaler 138. The preamplifier 136 provides a proper signal level to the prescaler 138. A prescaler 138 divides the input signal frequency by a predetermined factor, such as 128 in the particular embodiment, so that the microcontroller may calculate the frequency of the signal that exceeds the microcontroller's own clock signal. Now, more details about the connection of the apparatus 9 to an antenna or to a cable will be described.

Figure 5A:
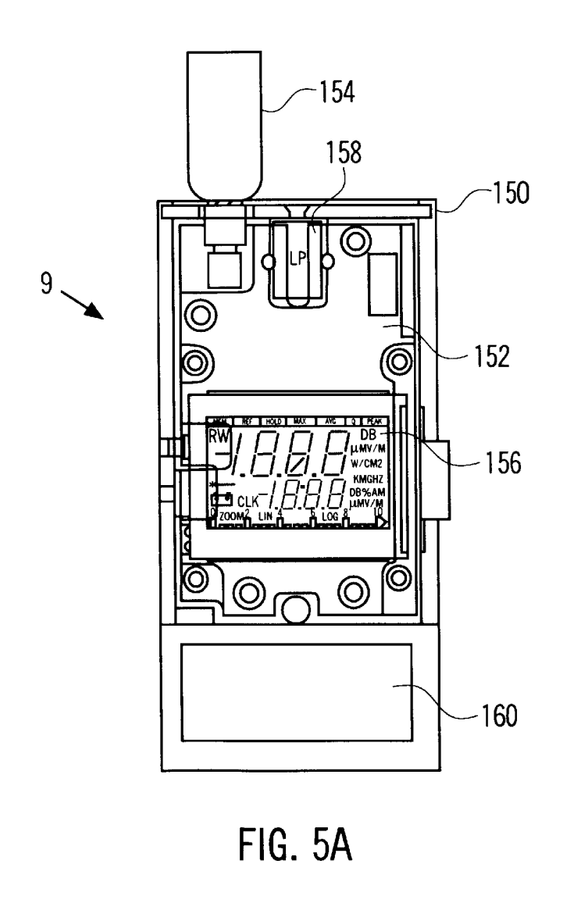
FIGS. 5A and 5B illustrate the internal construction of the apparatus in accordance with the invention with an antenna or a cable, respectively.
Figure 5B:
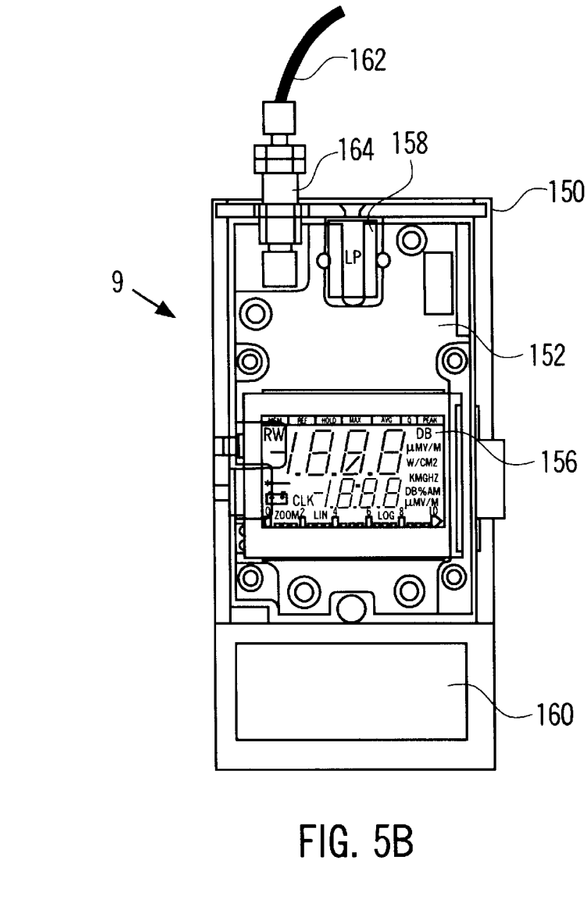

FIG. 5A shows a cross-section of a preferred embodiment of the apparatus 9. As shown, the apparatus 9 may include a printed circuit (PC) board assembly 152, an antenna assembly 154, a display 156, a laser pointer 158 and a battery 160. This embodiment includes the antenna for receiving electromagnetic radiation. Due to the optimization of the circuitry described above and the layout of the circuitry and apparatus, the apparatus 9 is small such that it is highly portable. FIG. 5B shows a cross-section of another embodiment of the apparatus 9 which contains many of the same elements as the embodiment shown in FIG. 5A which will not be described again. In this embodiment, instead of an antenna assembly 154, the apparatus may have a signal source connected to the apparatus via a cable 162 and an adapter 164. In accordance with the invention, for example, an antenna may be connected to the end of the cable permitting the antenna to be moved separate from the apparatus body. Thus, the apparatus in accordance with the invention may be used to detect both free-space electromagnetic radiation as well as electromagnetic radiation emanating from a signal source connected to the apparatus by a cable.

Figure 6A:
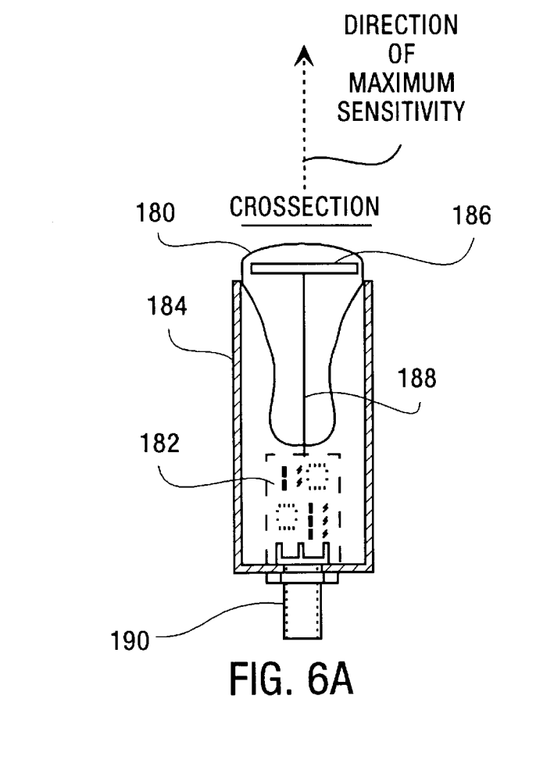
FIGS. 6A and 6B are a top and cross-sectional view, respectively, illustrating a first embodiment of a directional antenna assembly in accordance with the invention.
Figure 6B:
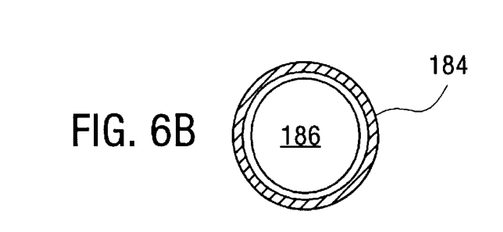

FIGS. 6A and 6B are a top view and a cross-sectional view, respectively, of a preferred antenna assembly in accordance with the invention. The antenna assembly may include a directional antenna 180 and a pre-amplifier 182 which are connected to each other by a wire 188. In the example shown, the preamplifier is located inside of a shielded antenna enclosure 184. The pre-amplifier 182 could also be placed outside the enclosure 184. However, if the pre-amplifier is located within the enclosure 184, it has many advantages, such as preventing spurious oscillations, better directional characteristics due to lack of signal pick-up by the preamplifier circuit from all directions and a better signal/noise ratio. It should be noted that the described highly-directional antenna does not have to include the built-in preamplifier to fulfill its purpose. In addition, the antenna without the preamplifier may be used as a directional transmitting antenna.

The body of the antenna assembly is a shielded enclosure 184 which is open at one end. A preferred embodiment of the antenna shows that the body of the antenna may be made as a cylindrical part closed at one end. The enclosure may be constructed out of any suitable material, such as copper, or any other similar shielding material. An antenna disk may be moved inside of the cylindrical enclosure so that it is closer or farther away from the opening of the enclosure. The antenna disk 186 is connected via wire 188 to the input of the preamplifier that is mounted on the RF connector 190 that is fastened to the enclosure 184. In absence of the preamplifier the wire would be connected to the RF connector 190 directly. Due to the design of the antenna (i.e., the flat disk), the antenna has a maximum sensitivity in a direction which is aligned with and parallel to the center axis of the cylindrical enclosure. Thus, the antenna in accordance with the invention has a directional sensitivity which permits it to more accurately locate a electromagnetic radiation source. In general, this antenna provides a 15 dB improvement in sensitivity in the desired direction (shown) over other conventional devices. This antenna also provides good directional characteristics at lower frequencies which are difficult to achieve with conventional small-size antennae. In addition, the directional characteristics of the antenna in accordance with the invention may be changed by moving the antenna disk within the enclosure. For example, the deeper the antenna disk is recessed into the enclosure, the more pronounced are the directional characteristics and the lower the sensitivity. The critical advantage of the proposed antenna construction is its ability to provide good broadband directionality in a miniature package which is not available in any current systems.

In order to achieve a flat frequency response in a broadband of frequencies, such as a range from about 1 MHz to about 1 GHz in a preferred embodiment, the antenna must be purposely de-tuned with its own resonance outside of the usable band. To accomplish this detuning, the antenna in accordance with a preferred embodiment of the invention has an outside diameter of ⅝" (15.8 mm) and length of approximately 1.5" (38 mm). Now, an embodiment of the antenna in which the user may further adjust the directional characteristics of the antenna will now be described. It is important to mention that the invention is not limited to the specific dimensions described above for the antenna because these dimensions may change depending on the desired directionality and sensitivity of the antenna.

Figure 7:
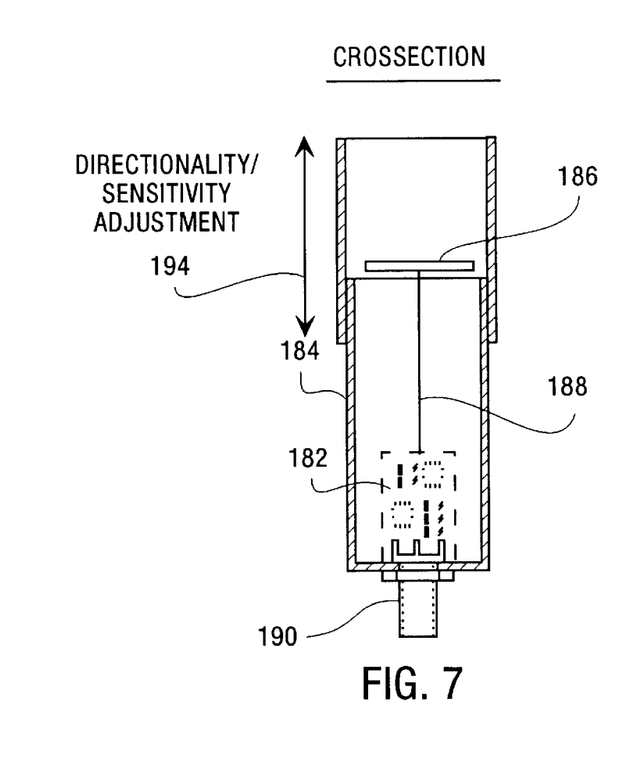
FIG. 7 is a cross-sectional view of a second embodiment of the directional antenna in accordance with the invention which includes a directivity adjustment mechanism.

FIG. 7 is a cross-sectional view of a second embodiment of the antenna assembly in accordance with the invention. In particular, the figure shows how a user may adjust the directional characteristics of the antenna. To achieve this adjustment, a sliding shielded attachment 194 is provided around the enclosure 184. In this embodiment, the enclosure is cylindrical shaped so that the sliding shielded attachment is also cylindrical. The shielded attachment may be moved up and down relative to the shielded enclosure 184 so that the antenna disk may be adjustable located at various depths within the shielded enclosure. The shielded sliding attachment 194 should have an electrical contact with the body of the antenna at all times. In a preferred embodiment of the shielded enclosure and sliding attachment, both may be manufactured of copper pipes of various diameters. As will be obvious to one of ordinary skill in the art, if the shielded enclosure has a shape other than a cylinder, then the antenna disk 186 may have another shapes as well and the invention is not limited to any particular shape of the shielded enclosure or the antenna disk. Now, the outer covering of the apparatus in accordance with the invention will be described with reference to FIG. 8.

Figure 8:
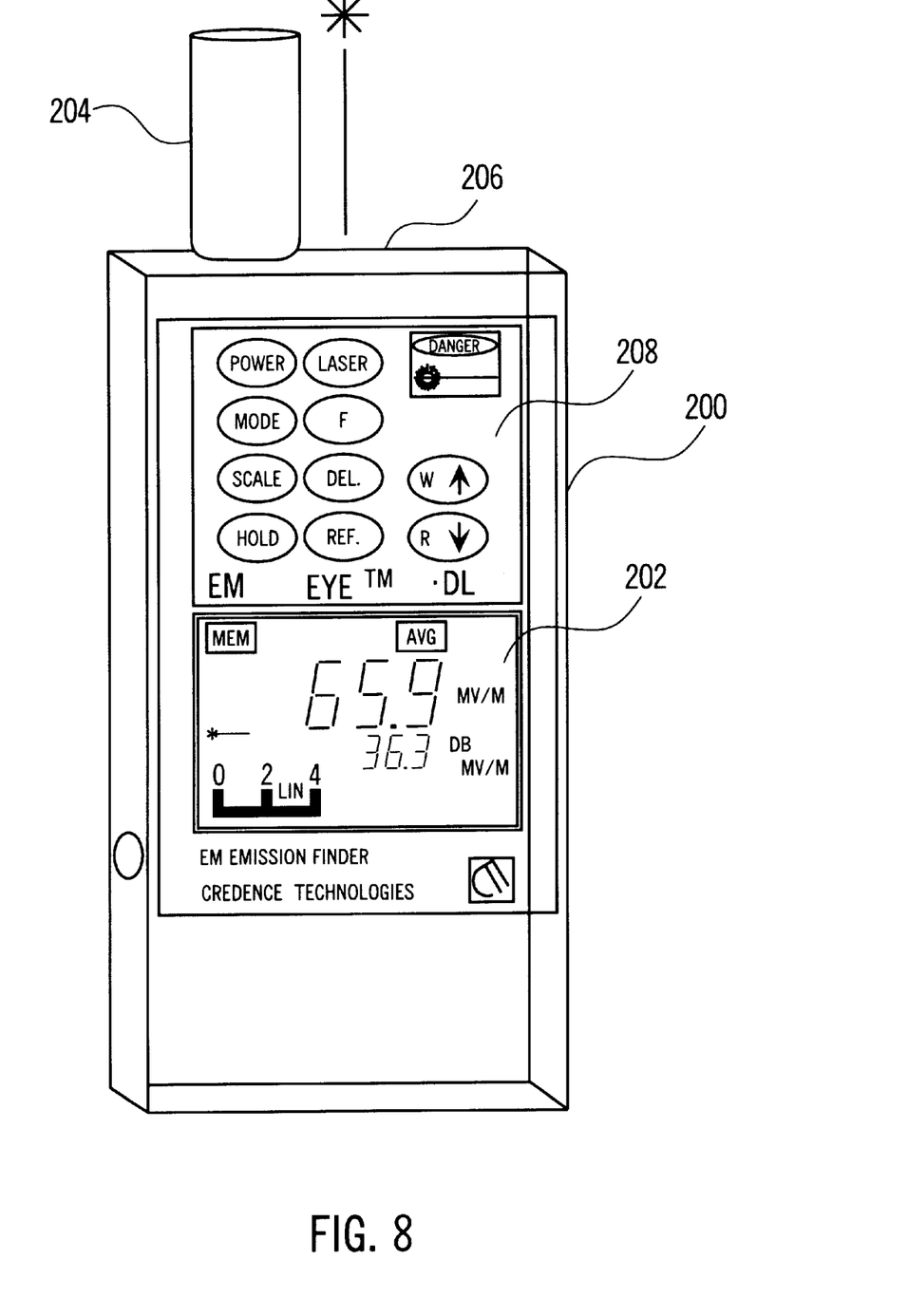
FIG. 8 is a diagram illustrating a perspective view of an apparatus in accordance with a preferred embodiment of the invention.

FIG. 8 is a perspective view of a preferred embodiment of the invention. As shown, the apparatus includes an enclosure 200, a display 202, an antenna assembly 204, a laser pointer 206 and a keypad 208. In operation, the user may point the directional antenna at a radiation source using the laser pointer as a guide. Once the apparatus has been properly aligned, the user may activate the measurement functions of the apparatus so that the apparatus may display, on the display, various information about the radiation source. If the user has selected the range finding function or entered the range to the radiation source manually, the apparatus will automatically calculate the power being emitted by the radiation source.

While the foregoing has been with reference to a particular embodiment of the invention, it will be appreciated by those skilled in the art that changes in this embodiment may be made without departing from the principles and spirit of the invention, the scope of which is defined by the appended claims.

What is claimed is:

1. An apparatus for detecting and measuring electromagnetic radiation from a radiation source, the apparatus comprising:
   means for receiving electromagnetic radiation from the radiation source;
   means for determining a distance from the apparatus to the radiation source;
   means for determining a value of one or more characteristics of the electromagnetic radiation; and
   means for generating a value equal to the power of the radiation source based on the one or more characteristics of the electromagnetic radiation and the distance from the apparatus to the radiation source.

2. The apparatus of claim 1, wherein the value determining means comprises a detector that determines the magnitude of the electromagnetic radiation corresponding to the field strength of the electromagnetic radiation, and wherein said characteristic of said electromagnetic radiation comprises the field strength of said electromagnetic radiation.

3. The apparatus of claim 1, wherein said receiving means comprises a directional antenna having an axis of sensitivity pointed towards the radiation source.

4. The apparatus of claim 3, wherein the directional antenna is removable from the apparatus so that the directional antenna is independently directable towards the radiation source.

5. The apparatus of claim 3 further comprising a cable attached to the apparatus, and wherein the receiving means comprises an antenna attached to the apparatus via the cable so that the antenna is independently directable towards the radiation source.

6. The apparatus of claim 3 further comprising means for visually pointing the directional antenna towards the radiation source.

7. The apparatus of claim 6, wherein said visually pointing means comprises a laser pointer.

8. The apparatus of claim 3, wherein said directional antenna further comprises a shielded enclosure having an opening, the shielded enclosure surrounding an antenna element which is located in the shielded enclosure so that the antenna element receives electromagnetic radiation only through the opening in the shielded enclosure.

9. The apparatus of claim 8, wherein the directional antenna further comprises means for adjusting the directional sensitivity of the directional antenna.

10. The apparatus of claim 9, wherein the adjusting means comprises a cover slideably located adjacent the shielded enclosure to further enhance the directional sensitivity of the antenna.

11. The apparatus of claim 10, wherein the adjusting means further comprises means for adjusting the position of the antenna element relative to the shielded enclosure along the axis of directional sensitivity of the antenna element.

12. The apparatus of claim 1, wherein the distance determining means comprises a range finder.

13. The apparatus of claim 1, wherein the distance determining means comprises means for manually entering the distance into the apparatus.

14. The apparatus of claim 1, wherein the value determining means comprises means for determining a peak, average and quasi-peak magnitudes of the received electromagnetic radiation, means for determining the amplitude modulation of the received electromagnetic radiation and means for determining the frequency of the received electromagnetic radiation.

15. The apparatus of claim 1 further comprising a tuner for tuning the frequency response of the receiving means to a predetermined frequency.

16. An apparatus for detecting, locating and measuring electromagnetic radiation from a radiation source, the apparatus comprising:
   a pointer for determining a location of the radiation source;
   an antenna having a predetermined gain and a directional sensitivity along an axis, the directional sensitivity of the antenna being adjustable to be directed towards the radiation source to receive radiation from the radiation source but not interfering radiation sources; and
   a detector for generating a value equal to a characteristic of the electromagnetic radiation.

17. The apparatus of claim 16 further comprising means for determining a distance from the apparatus to the radiation source and means for generating a value equal to the power of the radiation source based on the value of the characteristic of the electromagnetic radiation and the distance from the apparatus to the radiation source.

18. The apparatus of claim 17, wherein the distance determining means comprises a range finder.

19. The apparatus of claim 17, wherein the distance determining means comprises means for manually entering the distance into the apparatus.

20. The apparatus of claim 17, wherein the value generating means comprises means for determining a peak, average and quasi-peak magnitudes of the received electromagnetic radiation, means for determining the amplitude modulation of the received electromagnetic radiation and means for determining the frequency of the received electromagnetic radiation.

21. The apparatus of claim 16, wherein said antenna comprises an antenna element which is movable so that the antenna element is independently directable towards the radiation source.

22. The apparatus of claim 16 further comprising a cable attached to the apparatus, and wherein the antenna is attached to the apparatus via the cable so that the antenna is independently directable towards the radiation source.

23. The apparatus of claim 16, wherein the axis of directional sensitivity of said antenna is aligned with the axis of the pointer.

24. The apparatus of claim 16, wherein the pointer comprises a laser pointer.

25. The apparatus of claim 16 further comprising a tuner for tuning the frequency response of the receiving means to a predetermined frequency.

26. A method for detecting and measuring the power of an electromagnetic radiation from a radiation source, comprising:
   receiving electromagnetic radiation from the radiation source;
   determining a distance from the apparatus to the radiation source;
   determining a value of one or more characteristics of the electromagnetic radiation; and
   generating a value equal to the power of the radiation source based on the one or more characteristics of the electromagnetic radiation and the distance from the apparatus to the radiation source.

27. The method of claim 26, wherein the value generating comprises determining the magnitude of the electromagnetic radiation corresponding to the field strength of the electromagnetic radiation, and wherein said characteristic of said electromagnetic radiation comprises the field strength of said electromagnetic radiation.

28. The method of claim 26, wherein said receiving comprises using a directional antenna having an axis of sensitivity pointed towards the radiation source.

29. The method of claim 26, wherein receiving comprises using an antenna element removable from the apparatus so that the antenna is independently directable towards the radiation source.

30. The method of claim 26 further comprising attaching a cable to the apparatus, and wherein receiving comprises attaching an antenna to the apparatus via the cable so that the antenna is independently directable towards the radiation source.

31. The method of claim 26 further comprising means for visually pointing the directional antenna towards the radiation source.

32. The method of claim 26, wherein the distance determining comprises manually entering the distance into the apparatus.

33. The method of claim 26, wherein the value generating comprises determining a peak, average and quasi-peak magnitudes of the received electromagnetic radiation, determining the amplitude modulation of the received electromagnetic radiation and determining the frequency of the received electromagnetic radiation.

34. The method of claim 26 further comprising tuning the frequency response of the antenna to a predetermined frequency.

35. An apparatus for detecting and measuring electromagnetic radiation from a radiation source, the apparatus comprising:

an antenna that receives electromagnetic radiation from a radiation source;

a range finder that determines the distance between the apparatus and the radiation source;

detectors that determine a value of one or more characteristics of the electromagnetic radiation based on the received electromagnetic radiation; and a processor that generates a value equal to the power of the radiation source based on the one or more characteristics of the electromagnetic radiation and the distance from the apparatus to the radiation source.

* * * * *